United States Patent
Reiss et al.

(10) Patent No.: US 9,701,871 B2
(45) Date of Patent: Jul. 11, 2017

(54) COMPOSITION AND METHOD FOR POLISHING BULK SILICON

(71) Applicant: Cabot Microelectronics Corporation, Aurora, IL (US)

(72) Inventors: Brian Reiss, Woodridge, IL (US); John Clark, Pflugerville, TX (US); Lamon Jones, Aurora, IL (US); Jeffrey Gilliland, Aurora, CO (US); Michael White, Ridgefield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/509,081

(22) Filed: Oct. 8, 2014

(65) Prior Publication Data

US 2015/0028254 A1   Jan. 29, 2015

Related U.S. Application Data

(62) Division of application No. 12/462,638, filed on Sep. 16, 2009, now Pat. No. 8,883,034.

(51) Int. Cl.
*C09K 13/06* (2006.01)
*C09G 1/02* (2006.01)
*C09K 3/14* (2006.01)
*H01L 21/02* (2006.01)

(52) U.S. Cl.
CPC .............. *C09G 1/02* (2013.01); *C09K 3/1463* (2013.01); *H01L 21/02024* (2013.01)

(58) Field of Classification Search
None
See application file for complete search history.

(56) References Cited

U.S. PATENT DOCUMENTS

| | | | | |
|---|---|---|---|---|
| 6,524,167 | B1 * | 2/2003 | Tsai | C09G 1/02 257/E21.304 |
| 2003/0153184 | A1 * | 8/2003 | Wang | H01L 21/3212 438/689 |
| 2004/0020134 | A1 * | 2/2004 | Kim | C09G 1/02 51/307 |
| 2007/0068086 | A1 * | 3/2007 | Akatsuka | C09G 1/02 51/307 |
| 2009/0130849 | A1 * | 5/2009 | Lee | B24B 37/044 438/693 |

OTHER PUBLICATIONS

Qafsaoui et al, (Study of different triazole derivativ inhibitors to protect copper against pitting corrosion), Aug. 2000, Journal of Applied Electochemistry, first paragraph.*

* cited by examiner

*Primary Examiner* — Binh X Tran
*Assistant Examiner* — David Cathey, Jr.
(74) *Attorney, Agent, or Firm* — Thomas Omholt; Erika Wilson; Francis J. Koszyk

(57) ABSTRACT

The invention provides a polishing composition comprising (a) silica, (b) one or more compounds that increases the removal rate of silicon, (c) one or more tetraalkylammonium salts, and (d) water, wherein the polishing composition has a pH of about 7 to about 11. The invention further provides a method of polishing a substrate with the polishing composition.

13 Claims, 1 Drawing Sheet

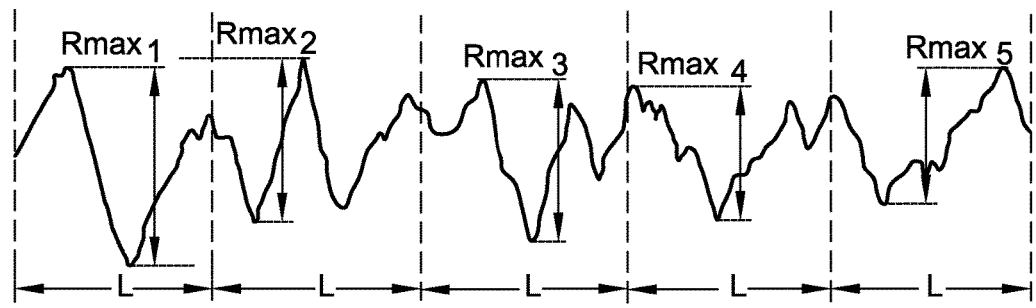

COMPOSITION AND METHOD FOR POLISHING BULK SILICON

BACKGROUND OF THE INVENTION

Silicon wafers used in electronic devices are typically prepared from a single crystal silicon ingot that is first sliced into thin wafers using a diamond saw, lapped to improve flatness, and etched to remove subsurface damage caused by lapping. The silicon wafers are then typically polished in a two-step process to remove nanotopography caused by etching and to achieve the desired thickness before the wafers are acceptable for use in electronic devices.

In the first polishing step, a high removal rate is required, and ideally the nanotopography would not be worsened during this step. Nanotopography is a parameter that measures the front-surface topology of an area and is defined as the deviation of a surface within a spatial wavelength of around 0.2 to 20 mm. Nanotopography differs from surface flatness in that, for nanotopography, the flatness of the wafer surface is measured relative to the wafer surface itself, while for surface flatness, the flatness of the wafer surface is measured relative to a flat chuck used to hold the wafer. Thus, a wafer may have perfect flatness, yet still have nanotopography. If a wafer has surface irregularities on the front and back sides of the wafer, but the front and back surfaces are parallel, the wafer has perfect flatness. However, the same wafer will exhibit nanotopography. Nanotopography bridges the gap between roughness and flatness in the topology map of wafer surface irregularities in spatial frequency.

Conventional polishing compositions for silicon wafers exhibit high removal rates for silicon, but produce increased nanotopography of the silicon wafers. The increased nanotopography puts increased demands on the second, final polishing step to produce silicon wafers suitable for further processing into semiconductor substrates. Thus, there remains a need in the art for improved polishing compositions for silicon wafers.

BRIEF SUMMARY OF THE INVENTION

The invention provides a polishing composition comprising (a) silica, (b) a compound or compounds that increases the removal rate of silicon, (c) a tetraalkylammonium salt, and (d) water, wherein the polishing composition has a pH of about 7 to about 11.

A first embodiment of the inventive chemical-mechanical polishing composition comprises a chemical mechanical polishing composition consisting essentially of or consisting of (a) about 0.5 wt. % to about 20 wt. % of silica, (b) about 0.02 wt. % to about 5 wt. % of one or more organic carboxylic acids, (c) about 0.02 wt. % to about 2 wt. % of one or more aminophosphonic acids, (d) about 0.1 wt. % to about 5 wt. % of one or more tetraalkylammonium salts, (e) optionally one or more bicarbonate salts, (0 optionally potassium hydroxide, and (g) water, wherein the polishing composition has a pH of about 7 to about 11.

A second embodiment of the inventive chemical-mechanical polishing composition comprises a chemical mechanical polishing composition consisting essentially of or consisting of (a) about 0.5 wt. % to about 20 wt. % of silica, (b) about 0.01 wt. % to about 2 wt. % of one or more polyaminocarboxylic acids, (c) about 0.05 wt. % to about 5 wt. % of one or more amines, (d) about 0.1 wt. % to about 5 wt. % of one or more tetraalkylammonium salts, (e) about 0.001 wt. % to about 1 wt. % of one or more diol compounds, (f) optionally one or more bicarbonate salts, and (g) water, wherein the polishing composition has a pH of about 7 to about 11.

A third embodiment of the inventive chemical-mechanical polishing composition comprises a chemical mechanical polishing composition consisting essentially of or consisting of (a) about 0.5 wt. % to about 20 wt. % of silica, (b) about 0.01 wt. % to about 2 wt. % of one or more polyaminocarboxylic acids, (c) about 0.1 wt. % to about 5 wt. % of one or more tetraalkylammonium salts, (d) about 0.01 wt. % to about 5 wt. % of one or more organic carboxylic acids, (e) optionally about 0.1 wt. % to about 5 wt. % of one or more amines, (f) optionally one or more bicarbonate salts, and (g) water, wherein the polishing composition has a pH of about 7 to about 11.

A fourth embodiment of the inventive chemical-mechanical polishing composition comprises a chemical mechanical polishing composition consisting essentially of or consisting of (a) about 0.5 wt. % to about 20 wt. % of silica, (b) about 0.02 wt. % to about 5 wt. % of one or more nitrogen-containing heterocyclic compounds, (c) about 0.05 wt. % to about 2 wt. % of one or more aminophosphonic acids, (d) about 0.1 wt. % to about 5 wt. % of one or more tetraalkylammonium salts, (e) optionally one or more bicarbonate salts, and (f) water, wherein the polishing composition has a pH of about 7 to about 11.

The invention also provides a method for chemically-mechanically polishing a substrate with the inventive chemical-mechanical polishing composition.

A first embodiment of the inventive method for chemically-mechanically polishing a substrate comprises (i) contacting a substrate with a polishing pad and a chemical mechanical polishing composition consisting essentially of or consisting of (a) about 0.5 wt. % to about 20 wt. % of silica, (b) about 0.02 wt. % to about 5 wt. % of one or more organic carboxylic acids, (c) about 0.02 wt. % to about 2 wt. % of one or more aminophosphonic acids, (d) about 0.1 wt. % to about 5 wt. % of one or more tetraalkylammonium salts, (e) optionally one or more bicarbonate salts, (f) optionally potassium hydroxide, and (g) water, wherein the polishing composition has a pH of about 7 to about 11, (ii) moving the polishing pad relative to the substrate with the chemical-mechanical polishing composition therebetween, and (iii) abrading at least a portion of the substrate to polish the substrate.

A second embodiment of the inventive method for chemically-mechanically polishing a substrate comprises (i) contacting a substrate with a polishing pad and a chemical mechanical polishing composition consisting essentially of or consisting of (a) about 0.5 wt. % to about 20 wt. % of silica, (b) about 0.01 wt. % to about 2 wt. % of one or more polyaminocarboxylic acids, (c) about 0.05 wt. % to about 5 wt. % of one or more amines, (d) about 0.1 wt. % to about 5 wt. % of one or more tetraalkylammonium salts, (e) about 0.001 wt. % to about 1 wt. % of one or more diol compounds, (f) optionally one or more bicarbonate salts, and (g) water, wherein the polishing composition has a pH of about 7 to about 11, (ii) moving the polishing pad relative to the substrate with the chemical-mechanical polishing composition therebetween, and (iii) abrading at least a portion of the substrate to polish the substrate.

A third embodiment of the inventive method for chemically-mechanically polishing a substrate comprises (i) contacting a substrate with a polishing pad and a chemical mechanical polishing composition consisting essentially of or consisting of (a) about 0.5 wt. % to about 20 wt. % of silica, (b) about 0.01 wt. % to about 2 wt. % of one or more polyaminocarboxylic acids, (c) about 0.1 wt. % to about 5 wt. % of one or more tetraalkylammonium salts, (d) about 0.01 wt. % to about 5 wt. % of one or more organic carboxylic acids, (e) optionally about 0.1 wt. % to about 5 wt. % of one or more amines, (f) optionally one or more bicarbonate salts, and (g) water, wherein the polishing composition has a pH of about 7 to about 11, (ii) moving the polishing pad relative to the substrate with the chemical-mechanical polishing composition therebetween, and (iii) abrading at least a portion of the substrate to polish the substrate.

A fourth embodiment of the inventive method for chemically-mechanically polishing a substrate comprises (i) contacting a substrate with a polishing pad and a chemical mechanical polishing composition consisting essentially of or consisting of (a) about 0.5 wt. % to about 20 wt. % of silica, (b) about 0.02 wt. % to about 5 wt. % of one or more nitrogen-containing heterocyclic compounds, (c) about 0.05 wt. % to about 2 wt. % of one or more aminophosphonic acids, (d) about 0.1 wt. % to about 5 wt. % of one or more tetraalkylammonium salts, (e) optionally one or more bicarbonate salts, and (f) water, wherein the polishing composition has a pH of about 7 to about 11, (ii) moving the polishing pad relative to the substrate with the chemical-mechanical polishing composition therebetween, and (iii) abrading at least a portion of the substrate to polish the substrate.

BRIEF DESCRIPTION OF THE DRAWING(S)

The FIGURE is a schematic drawing that illustrates the surface parameter $R_{max}$.

DETAILED DESCRIPTION OF THE INVENTION

The invention provides a polishing composition comprising (a) silica, (b) a compound or compounds that increases the removal rate of silicon, (c) a tetraalkylammonium salt, and (d) water, wherein the polishing composition has a pH of about 7 to about 11.

The silica can be any suitable form of silica such as wet-process type silica, fumed silica, or combinations thereof. For example, the silica can comprise wet-process type silica particles (e.g., condensation-polymerized or precipitated silica particles). Condensation-polymerized silica particles typically are prepared by condensing $Si(OH)_4$ to form colloidal particles, where colloidal particles are defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product, the Nalco DVSTS006 product, and the Fuso PL-2 product, as well as other similar products available from DuPont, Bayer, Applied Research, Nissan Chemical, and Clariant.

The silica can comprise fumed silica particles. Fumed silica particles can be produced from volatile precursors (e.g., silicon halides) in a pyrogenic process by hydrolysis and/or oxidation of the precursors in a high temperature flame ($H_2$/air or $H_2$/$CH_4$/air) to produce the fumed silica. The solution containing the precursor can be sprayed into a high temperature flame using a droplet generator, and the metal oxide can then be collected. Typical droplet generators include bi-fluid atomizers, high-pressure spray nozzles, and ultrasonic atomizers. Suitable fumed silica products are commercially available from producers such as Cabot, Tokuyama, and Degussa.

The silica can have any suitable average particle size (i.e., average particle diameter). The silica can have an average particle size of about 10 nm or more, e.g., about 15 nm or more, about 20 nm or more, or about 25 nm or more. Alternatively, or in addition, the silica can have an average particle size of about 120 nm or less, e.g., about 110 nm or less, about 100 nm or less, about 90 nm or less, about 80 nm or less, about 70 nm or less, about 60 nm or less, 50 nm or less, or about 40 nm or less. Thus, the silica can have an average particle size bounded by any two of the above endpoints. For example, the silica can have an average particle size of about 10 nm to about 100 nm, about 20 nm to about 100 nm, about 20 nm to about 80 nm, about 20 nm to about 60 nm, or about 20 nm to about 40 nm. For a non-spherical silica particle, the size of the particle is the diameter of the smallest sphere that encompasses the particle.

The polishing composition can comprise any suitable amount of silica. Typically, the polishing composition can contain about 0.5 wt. % or more, e.g., about 1 wt. % or more, about 2 wt. % or more, or about 5 wt. % or more of silica. Alternatively, or in addition, the polishing composition can contain about 20 wt. % or less, e.g., about 15 wt. % or less, about 10 wt. % or less, about 8 wt. % or less, about 6 wt. % or less, or about 5 wt. % or less of silica. Thus, the polishing composition can comprise silica in an amount bounded by any two of the above endpoints recited for silica. For example the polishing composition can comprise about 0.5 wt. % to about 20 wt. %, about 1 wt. % to about 15 wt. %, about 5 wt. % to about 15 wt. %, or about 0.5 wt. % to about 5 wt. % of silica.

The silica particles preferably are colloidally stable. The term colloid refers to the suspension of silica particles in the liquid carrier. Colloidal stability refers to the maintenance of that suspension through time. In the context of this invention, an abrasive is considered colloidally stable it when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition comprises water. The water is used to facilitate the application of the abrasive particles, compound(s) that increase the removal rate of silicon, and any other additives to the surface of a suitable substrate to be polished or planarized. Preferably, the water is deionized water.

The polishing composition has a pH of about 11 or less (e.g., about 10 or less). Preferably, the polishing composition has a pH of about 7 or more (e.g., about 8 or more). Even more preferably, the polishing composition has a pH of about 7 to about 11 (e.g., about 8 to about 10). The polishing composition optionally contains pH adjusting agents, for example, potassium hydroxide, ammonium hydroxide, and/or nitric acid. The polishing composition also optionally comprises pH buffering systems. Many such pH buffering systems are well known in the art. The pH buffering agent can be any suitable buffering agent, for example, bicarbonate-carbonate buffer systems, aminoalkylsulfonic acids, and the like. The polishing composition can comprise any suitable amount of a pH adjustor and/or a pH buffering agent, provided that a suitable amount is used to achieve and/or maintain the pH of the polishing composition within a suitable range.

A first embodiment of the inventive chemical-mechanical polishing composition provides a chemical mechanical polishing composition consisting essentially of or consisting of (a) about 0.5 wt. % to about 20 wt. % of silica, (b) about 0.02 wt. % to about 5 wt. % of an organic carboxylic acid, (c) about 0.02 wt. % to about 2 wt. % of an aminophosphonic acid, (d) about 0.1 wt. % to about 5 wt. % of a tetraalkylammonium salt, (e) optionally a bicarbonate salt, (f) optionally potassium hydroxide, and (g) water, wherein the polishing composition has a pH of about 7 to about 11.

The polishing composition of the first embodiment contains one or more suitable organic carboxylic acids or salts thereof. The organic carboxylic acid can be an alkyl carboxylic acid or aryl carboxylic acid and can be optionally substituted with groups selected from the group consisting of $C_1$-$C_{12}$ alkyl, amino, substituted amino (e.g., methylamino, dimethylamino, and the like), hydroxyl, halogen, and combinations thereof. Preferably, the organic carboxylic acid is a hydroxycarboxylic acid (e.g., an aliphatic hydroxycarboxylic acid or a hydroxybenzoic acid), an amino acid, an amino hydroxybenzoic acid, or a pyridine carboxylic acid. Non-limiting examples of suitable hydroxycarboxylic acids include malonic acid, lactic acid, malic acid, tartaric acid, acetohydroxamic acid, glycolic acid, 2-hydroxybutyric acid, benzilic acid, salicylic acid, and 2,6-dihydroxybenzoic acid. Non-limiting examples of suitable amino acids include glycine, alanine, proline, lysine, cysteine, leucine, aspartic acid, glutamic acid, and 2-amino-4-thiazolacetic acid. Non-limiting examples of an amino hydroxybenzoic acid include 3-aminosalicylic acid and 3-amino-4-hydroxybenzoic acid. Non-limiting examples of pyridine carboxylic acids include picolinic acid and nicotinic acid.

The polishing composition of the first embodiment can contain any suitable amount of the organic carboxylic acid(s). The polishing composition can contain about 0.02 wt. % or more, e.g., about 0.05 wt. % or more, about 0.1 wt. % or more, or about 0.5 wt. % or more of the organic carboxylic acid(s). Alternatively, or in addition, the polishing composition can contain about 5 wt. % or less, e.g., about 4 wt. % or less, about 3 wt. % or less, about 2 wt. % or less, or about 1 wt. % or less of the organic carboxylic acid(s). Thus, the polishing composition can comprise the organic carboxylic acid(s) in an amount bounded by any two of the above endpoints recited for the organic carboxylic acid(s). For example the polishing composition can comprise about 0.02 wt. % to about 5 wt. %, 0.05 wt. % to about 4 wt. %, or about 0.1 wt. % to about 3 wt. % of the organic carboxylic acid(s).

The polishing composition of the first embodiment contains one or more suitable aminophosphonic acids. Preferably, the aminophosphonic acid is selected from the group consisting of ethylenediaminetetra(methylene phosphonic acid), amino tri(methylene phosphonic acid), diethylenetriaminepenta(methylene phosphonic acid), salts thereof, and combinations thereof. More preferably, the aminophosphonic acid is amino tri(methylene phosphonic acid).

The polishing composition of the first embodiment can contain any suitable amount of the aminophosphonic acid(s). Typically, the polishing composition can contain about 0.02 wt. % or more, e.g., about 0.1 wt. % or more, about 0.2 wt. % or more, or about 0.5 wt. % or more of the aminophosphonic acid(s). Alternatively, or in addition, the polishing composition can contain about 2 wt. % or less, e.g., about 1.5 wt. % or less, or about 1 wt. % or less of the aminophosphonic acid(s). Thus, the polishing composition can comprise the aminophosphonic acid(s) in an amount bounded by any two of the above endpoints recited for the aminophosphonic acid(s). For example the polishing composition can comprise about 0.02 wt. % to about 2 wt. %, 0.1 wt. % to about 1.5 wt. %, or about 0.5 wt. % to about 1 wt. % of the aminophosphonic acid(s).

The polishing composition of the first embodiment comprises one or more suitable tetraalkylammonium salt(s). The tetraalkylammonium salt preferably comprises a cation selected from the group consisting of tetramethylammonium, tetraethylammonium, tetrapropylammonium, and tetrabutylammonium. The tetraalkylammonium salt can have any suitable cation including but not limited to hydroxide, chloride, bromide, sulfate, or hydrogensulfate. In an embodiment, the tetraalkylammonium salt is a tetraalkylammonium hydroxide (e.g., tetramethylammonium hydroxide).

The polishing composition of the first embodiment can comprise any suitable amount of the tetraalkylammonium salt(s). Typically, the polishing composition can contain about 0.1 wt. % or more, e.g., about 0.1 wt. % or more, about 0.2 wt. % or more, or about 0.5 wt. % or more of the tetraalkylammonium salt(s). Alternatively, or in addition, the polishing composition can contain about 5 wt. % or less, e.g., about 4 wt. % or less, about 3 wt. % or less, about 2 wt. % or less, or about 1 wt. % or less of the tetraalkylammonium salt(s). Thus, the polishing composition can comprise the tetraalkylammonium salt(s) in an amount bounded by any two of the above endpoints recited for the tetraalkylammonium salt(s). For example the polishing composition can comprise about 0.1 wt. % to about 5 wt. %, 0.2 wt. % to about 4 wt. %, or about 0.5 wt. % to about 3 wt. % of the tetraalkylammonium salt(s).

A second embodiment of the inventive chemical-mechanical polishing composition provides a chemical mechanical polishing composition consisting essentially of or consisting of (a) about 0.5 wt. % to about 20 wt. % of silica, (b) about 0.01 wt. % to about 2 wt. % of a polyaminocarboxylic acid, (c) about 0.1 wt. % to about 5 wt. % of an amine, (d) about 0.1 wt. % to about 5 wt. % of a tetraalkylammonium salt, (e) about 0.001 wt. % to about 1 wt. % of a diol compound, (f) optionally a bicarbonate salt, and (g) water, wherein the polishing composition has a pH of about 7 to about 11.

The polishing composition of the second embodiment comprises one or more suitable polyaminocarboxylic acids. The term polyaminocarboxylic acid as used herein refers to a compound having two or more amino groups and two or more carboxylic acid groups. Preferably, the polyaminocarboxylic acid is selected from the group consisting of ethylenediaminetetraacetic acid, diethylenetriaminepentaacetic acid, N-(hydroxyethyl)ethylenediaminetriacetic acid, nitrilotriacetic acid, methylglycinediacetic acid, salts thereof, and combinations thereof. More preferably, the polyaminocarboxylic acid is selected from the group consisting of ethylenediaminetetraacetic acid or a salt thereof (e.g., a mono-, di-, tri-, or tetrasodium salt thereof).

The polishing composition of the second embodiment can comprise any suitable amount of the polyaminocarboxylic acid(s). Typically, the polishing composition can contain about 0.01 wt. % or more, e.g., about 0.1 wt. % or more, about 0.2 wt. % or more, or about 0.5 wt. % or more of the polyaminocarboxylic acid(s). Alternatively, or in addition, the polishing composition can contain about 2 wt. % or less, e.g., about 1.5 wt. % or less, or about 1.0 wt. % or less of the polyaminocarboxylic acid(s). Thus, the polishing composition can comprise the polyaminocarboxylic acid(s) in an amount bounded by any two of the above endpoints recited for the polyaminocarboxylic acid(s). For example the polishing composition can comprise about 0.01 wt. % to about 2 wt. %, 0.1 wt. % to about 1.5 wt. %, or about 0.5 wt. % to about 1 wt. % of the polyaminocarboxylic acid(s).

The polishing composition of the second embodiment comprises one or more suitable amines. Non-limiting examples of suitable amines include piperazine, aminoethylpiperazine, 2-methyl-2-aminoethanol, (2-aminoethyl)-2-aminoethanol, ethanolamine, diethanolamine, triethanolamine, ethylenediamine, diethylenetriamine, tetraethylenepentamine, hydrazine, 2-hydroxyethylhydrazine, semicarbazide, hydroxylamine, N-methylhydroxylamine, O-methylhydroxylamine, and O-carboxymethylhydroxylamine. More preferably, the amine is piperazine or aminoethylpiperazine.

The polishing composition of the second embodiment can comprise any suitable amount of the amine(s). Typically, the polishing composition can contain about 0.05 wt. % or more, e.g., about 0.1 wt. % or more, about 0.2 wt. % or more, or about 0.5 wt. % or more of the amine(s). Alternatively, or in addition, the polishing composition can contain about 5 wt. % or less, e.g., about 4 wt. % or less, about 3 wt. % or less, about 2 wt. % or less, or about 1 wt. % or less of the amine(s). Thus, the polishing composition can comprise the amine(s) in an amount bounded by any two of the above endpoints recited for the amine(s). For example the polishing composition can comprise about 0.05 wt. % to about 5 wt. %, 0.2 wt. % to about 4 wt. %, or about 0.5 wt. % to about 3 wt. % of the amine(s).

The polishing composition of the second embodiment comprises one or more suitable tetraalkylammonium salts. The tetraalkylammonium salt and amount thereof can be as recited for the first embodiment of the polishing composition.

The polishing composition of the second embodiment comprises one or more suitable diol compounds. The diol compound can be any suitable diol compound and typically is a 1,2-diol compound or a 1,3-diol compound. Typically, the diol compound is a linear or branched-chain $C_2$-$C_{10}$ diol compound. Non-limiting examples of suitable 1,2-diol compounds include 1,2-propane diol, 1,2-butane diol, 1,2-pentane diol, 2,3-pentane diol, and combinations thereof. Non-limiting examples of suitable 1,3-diol compounds include 1,3-propane diol, 1,3-butane diol, 1,3-pentane diol, 2,4-pentane diol, and combinations thereof.

The polishing composition of the second embodiment can comprise any suitable amount of the diol compound(s). Typically, the polishing composition can contain about 0.001 wt. % or more, e.g., about 0.005 wt. % or more, about 0.01 wt. % or more, or about 0.05 wt. % or more of the diol compound(s). Alternatively, or in addition, the polishing composition can contain about 1 wt. % or less, e.g., about 0.75 wt. % or less, about 0.5 wt. % or less, about 0.25 wt. % or less, or about 0.1 wt. % or less of the diol compound(s). Thus, the polishing composition can comprise the diol compound(s) in an amount bounded by any two of the above endpoints recited for the diol compound(s). For example the polishing composition can comprise about 0.001 wt. % to about 1 wt. %, 0.005 wt. % to about 0.75 wt. %, or about 0.01 wt. % to about 0.5 wt. % of the diol compound(s).

A third embodiment of the inventive chemical-mechanical polishing composition comprises a chemical mechanical polishing composition consisting essentially of or consisting of (a) about 0.5 wt. % to about 20 wt. % of silica, (b) about 0.01 wt. % to about 2 wt. % of a polyaminocarboxylic acid, (c) about 0.1 wt. % to about 5 wt. % of a tetraalkylammonium salt, (d) about 0.1 wt. % to about 5 wt. % of an organic carboxylic acid, (e) optionally about 0.1 wt. % to about 5 wt. % of an amine, (f) optionally a bicarbonate salt, and (g) water, wherein the polishing composition has a pH of about 7 to about 11. The polyaminocarboxylic acid, tetraalkylammonium salt, organic carboxylic acid, amine, and amounts thereof contained in the third embodiment of the inventive chemical-mechanical polishing composition can be as recited herein for the first and second embodiments of the inventive polishing composition.

A fourth embodiment of the inventive chemical-mechanical polishing composition provides a chemical mechanical polishing composition consisting essentially of or consisting of (a) about 0.5 wt. % to about 20 wt. % of silica, (b) about 0.02 wt. % to about 5 wt. % of a nitrogen-containing heterocyclic compound, (c) about 0.05 wt. % to about 2 wt. % of an aminophosphonic acid, (d) about 0.1 wt. % to about 5 wt. % of a tetraalkylammonium salt, (e) optionally a bicarbonate salt, and (f) water, wherein the polishing composition has a pH of about 7 to about 11. The aminophosphonic acid, tetraalkylammonium salt, and amounts thereof contained in the fourth embodiment of the inventive chemical-mechanical polishing composition can be as recited herein for the first embodiment of the inventive polishing composition.

The polishing composition of the fourth embodiment comprises one or more suitable nitrogen-containing heterocyclic compounds. The term nitrogen-containing heterocyclic compound as used herein refers to a 5-, 6-, or 7-membered ring compound having one or more nitrogen atoms contained as part of the ring system. In an embodiment, the nitrogen-containing heterocyclic compound is a triazole. In a preferred embodiment, the nitrogen-containing heterocyclic compound is an aminotriazole. Non-limiting examples of suitable aminotriazoles include 3-amino-1,2,4-triazole, 3-amino-1,2,4-triazole-5-carboxylic acid, 3-amino-5-mercapto-1,2,4-triazole, and 4-amino-5-hydrazino-1,2,4-triazole-3-thiol. In another embodiment, the nitrogen-containing heterocyclic compound is a thiazole. Non-limiting examples of suitable thiazoles include 2-amino-5-methylthiazole, 2-amino-4-thoazoleacetic acid, and thiazole. In another embodiment, the nitrogen-containing heterocyclic compound is a heterocyclic N-oxide. Non-limiting examples of suitable heterocyclic N-oxides include 2-hydroxypyridine-N-oxide, 4-methylmorpholine-N-oxide, and picolinic acid N-oxide.

The polishing composition of the fourth embodiment can comprise any suitable amount of the nitrogen-containing heterocyclic compound. The polishing composition can contain about 0.02 wt. % or more, e.g., about 0.05 wt. % or more, about 0.1 wt. % or more, or about 0.5 wt. % or more of the nitrogen-containing heterocyclic compound(s). Alternatively, or in addition, the polishing composition can contain about 5 wt. % or less, e.g., about 4 wt. % or less, about 3 wt. % or less, about 2 wt. % or less, or about 1 wt. % or less of the nitrogen-containing heterocyclic compound(s). Thus, the polishing composition can comprise the nitrogen-containing heterocyclic compound(s) in an amount bounded by any two of the above endpoints recited for the nitrogen-containing heterocyclic compound(s). For example the polishing composition can comprise about 0.02 wt. % to about 5 wt. %, 0.05 wt. % to about 4 wt. %, or about 0.1 wt. % to about 3 wt. % of the nitrogen-containing heterocyclic compound(s).

The polishing composition optionally further contains one or more bicarbonate salts. The bicarbonate salt can be any suitable bicarbonate salt and can be, for example, potassium bicarbonate, sodium bicarbonate, ammonium bicarbonate, or combinations thereof.

The polishing composition can contain any suitable amount of the bicarbonate salt(s). Typically, the polishing composition can contain about 0.05 wt. % or more, e.g., about 0.1 wt. % or more, about 0.25 wt. % or more, or about 0.5 wt. % or more of the bicarbonate salt(s). Alternatively, or in addition, the polishing composition can contain about 5 wt. % or less, e.g., about 4 wt. % or less, about 3 wt. % or less, about 2 wt. % or less, or about 1 wt. % or less of the bicarbonate salt(s). Thus, the polishing composition can comprise the bicarbonate salt(s) in an amount bounded by any two of the above endpoints recited for the bicarbonate salt(s). For example the polishing composition can comprise about 0.05 wt. % to about 1 wt. %, 0.1 wt. % to about 4 wt. %, about 0.25 wt. % to about 3 wt. %, or about 0.5 wt. % to about 2 wt. % of the bicarbonate salt(s).

The polishing composition optionally further contains potassium hydroxide. The polishing composition can contain any suitable amount of potassium hydroxide. Typically, the polishing composition can contain about 0.05 wt. % or more, e.g., about 0.1 wt. % or more, or about 0.25 wt. % or more of potassium hydroxide. Alternatively, or in addition, the polishing composition can contain about 2 wt. % or less, e.g., about 1.5 wt. % or less, about 1 wt. % or less, about 0.8 wt. % or less, or about 0.6 wt. % or less of potassium hydroxide. Thus, the polishing composition can comprise potassium hydroxide in an amount bounded by any two of the above endpoints recited for potassium hydroxide. For example the polishing composition can comprise about 0.05 wt. % to about 1 wt. %, 0.1 wt. % to about 2 wt. %, about 0.1 wt. % to about 1 wt. %, or about 0.25 wt. % to about 0.8 wt. % of potassium hydroxide.

The polishing composition optionally further comprises one or more other additives. Such additives include any suitable dispersing agent, such as, for example, homopolymers or random, block, or gradient acrylate copolymers comprising one or more acrylic monomers (e.g., polyacrylates, polymethacrylates, vinyl acrylates and styrene acrylates), combinations thereof, and salts thereof. Other suitable additives include biocides. The biocide can be any suitable biocide, for example, an isothiazolinone biocide.

The polishing composition of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, compound(s) that increases the removal rate of silicon, tetraalkylammonium salt, etc.) as well as any combination of ingredients (e.g., silica, compound(s) that increases the removal rate of silicon, tetraalkylammonium salt, buffers, etc.).

For example, in one embodiment, the silica can be dispersed in water. The organic carboxylic acid, aminophosphonic acid, and tetraalkylammonium salt can then be added, and mixed by any method that is capable of incorporating the components into the polishing composition. Other compounds that increase the removal rate of silicon similarly can be utilized in the preparation of the polishing composition. The polishing composition can be prepared prior to use, with one or more components, such as a pH adjusting component, added to the polishing composition just before use (e.g., within about 7 days before use, or within about 1 hour before use, or within about 1 minute before use). The polishing composition also can be prepared by mixing the components at the surface of the substrate during the polishing operation.

The polishing composition also can be provided as a concentrate which is intended to be diluted with an appropriate amount of water prior to use. In such an embodiment, the polishing composition concentrate can comprise, for example, silica, a compound or compounds that increases the removal rate of silicon, a tetraalkylammonium salt, and water in amounts such that, upon dilution of the concentrate with an appropriate amount of water, each component of the polishing composition will be present in the polishing composition in an amount within the appropriate range recited above for each component. For example, the abrasive, compound or compounds that increases the removal rate of silicon, and tetraalkylammonium salt can each be present in the concentrate in an amount that is about 2 times (e.g., about 3 times, about 4 times, about 5 times, about 10 times, or about 15 times) greater than the concentration recited above for each component so that, when the concentrate is diluted with an equal volume of water (e.g., 2 equal volumes water, 3 equal volumes of water, 4 equal volumes of water, 9 equal volumes of water, or 14 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the compound or compounds that increases the removal rate of silicon, and other suitable additives are at least partially or fully dissolved in the concentrate.

The invention further provides a method of chemically-mechanically polishing a substrate comprising (i) contacting a substrate with a polishing pad and the polishing composition described herein, (ii) moving the polishing pad relative to the substrate with the polishing composition therebetween, and (iii) abrading at least a portion of the substrate to polish the substrate.

Although the polishing composition of the invention can be used to polish any substrate, the polishing composition is particularly useful in the polishing of a substrate comprising silicon, for example, silicon wafers used in the electronics industry. In this regard, the silicon can be undoped silicon, or it can be doped silicon, such as p-type silicon doped with boron or aluminum. In addition, the silicon can be polysilicon. The inventive polishing composition and method of use thereof is suitable for the pre-polishing or the final polishing of silicon wafers as produced from silicon single crystals by diamond sawing and rough grinding, as well as for edge polishing of silicon wafers and for use in the reclamation of silicon wafers by polishing.

Advantageously, the inventive polishing method exhibits improves nanotopography when used to polish silicon wafers after lapping and etching of diamond sawed silicon wafers. One way to measure change in nanotopography during chemical-mechanical polishing is to determine the value of the parameter: $\Delta R_z/d$ wherein $R_z$ is the average maximum height of the profile, $\Delta R_z$ is the change in $R_z$ from one time point to another time point, e.g., before and after chemical-mechanical polishing, and d is the amount of material removed in microns over that same time span, with the result expressed in nanometers. Referring to the FIGURE, $R_{max}$ represents the largest peak to valley height in a given sampling length L, and $R_z$ represents the average of 5

$R_{max}$ values in 5 contiguous sampling lengths. Sampling length L is approximately 5 mm. Suitable techniques for measuring $R_{max}$ (to enable the calculation of $R_z$) include stylus profilometry, optical profilometry, and atomic force microscopy. Suitable instruments for stylus profilometry and optical profilometry are available from, e.g., Veeco Instruments (Plainview, N.Y.). Desirably, the inventive polishing method results in a $\Delta R_z/d$ that is about zero or less, that is, substrate nanotopography is either unchanged or improved after use of the inventive polishing method.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Hard polyurethane polishing pads are particularly useful in conjunction with the inventive polishing method.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

EXAMPLE 1

This example demonstrates the effect of an organic carboxylic acid, an aminophosphonic acid, and a tetraalkylammonium salt on the removal rate and surface roughness observed for silicon substrates achievable by the polishing composition of the invention.

Seven similar substrates, which substrates comprised 102 cm (4 inch) diameter circular silicon wafers, were polished with seven different polishing compositions (Polishing Compositions 1A-1G). All of the polishing compositions contained 1 wt. % silica wet-process silica (Polishing Compositions 1A, 1B, 1D, and 1F) or fumed silica (Polishing Compositions 1C, 1E, and 1G), 0.27 wt. % tetramethylammonium hydroxide, and 0.05 wt. % potassium bicarbonate in water at a pH of about 10.5. Polishing Composition 1A (comparative) further contained 0.017 wt. % ethylenediaminetetraacetic acid and 0.067 wt. % piperazine. Polishing Compositions 1B-1G further contained 0.033 wt. % diethylenetriaminepenta(methylene phosphonic acid) and an organic carboxylic acid, which was either 0.08 wt. % malonic acid (Polishing Compositions 1B and 1C), 0.067 wt. % lactic acid (Polishing Compositions 1D and 1E), or 0.107 wt. % malic acid (Polishing Compositions 1F and 1G).

Following polishing, the removal rates for silicon and the magnitude of the change in nanotopography, $\Delta R_z/d$, were determined for each of the polishing compositions. The results are summarized in Table 1.

TABLE 1

| Polishing Composition | Silicon Removal Rate (Å/min) | $\Delta R_z/d$ (nm) |
|---|---|---|
| 1A (comparative) | 6500 | 6 |
| 1B (invention) | 5700 | 0 |
| 1C (invention) | 5200 | 0.1 |
| 1D (invention) | 5150 | 0.4 |
| 1E (invention) | 5650 | 0.4 |
| 1F (invention) | 5700 | −0.2 |
| 1G (invention) | 5400 | 0 |

As is apparent from the results set forth in Table 1, the inventive polishing compositions exhibited silicon removal rates that were approximately 79% to about 88% of the removal rate exhibited by the comparative polishing composition, yet the inventive polishing compositions exhibited a change in surface roughness caused by polishing that ranged from a decrease in surface roughness of approximately 0.2 nm (Polishing Composition 1F) to an increase in surface roughness of approximately 0.4 nm (Polishing Compositions 1D and 1E), while the comparative polishing composition exhibited an increase in surface roughness of approximately 6 nm.

EXAMPLE 2

This example demonstrates the effect of an organic carboxylic acid, a polyaminocarboxylic acid, and a tetraalkylammonium salt on the removal rate and surface roughness observed for silicon substrates achievable by the polishing composition of the invention.

Three similar substrates, which substrates comprised 102 cm (4 inch) diameter circular silicon wafers, were polished with three different polishing compositions (Polishing Compositions 2A-2C). Polishing Composition 2A (comparative) contained 1 wt. % wet-process silica, 0.0167 wt. % ethylenediaminetetraacetic acid, 0.067 wt. % piperazine, 0.27 wt. % tetramethylammonium hydroxide, and 0.05 wt. % potassium bicarbonate. Polishing Composition 2B (invention) contained 0.85 wt. % wet-process silica, 0.02 wt. % ethylenediaminetetraacetic acid, 0.083 wt. % oxalic acid, 0.2 wt. % tetramethylammonium hydroxide, and 0.1 wt. % potassium bicarbonate. Polishing Composition 2C (invention) contained 0.53 wt. % wet-process silica, 0.0167 wt. % ethylenediaminetetraacetic acid, 0.007 wt. % oxalic acid, 0.067 wt. % tetramethylammonium hydroxide, and 0.05 wt. % potassium bicarbonate.

Following polishing, the removal rates for silicon and the magnitude of the change in nanotopography, $\Delta R_z/d$, were determined for each of the polishing compositions. The results are summarized in Table 2.

TABLE 2

| Polishing Composition | Silicon Removal Rate (Å/min) | $\Delta R_z/d$ (nm) |
|---|---|---|
| 2A | 6700 | 4 |
| 2B | 5900 | −4 |
| 2C | 5500 | −7 |

As is apparent from the results set forth in Table 2, the inventive polishing compositions exhibited silicon removal rates that were approximately 82% to about 88% of the removal rate exhibited by the comparative polishing composition, yet the inventive polishing compositions exhibited a decrease in surface roughness caused by polishing of approximately 4 nm and 7 nm, as compared to an increase in surface roughness caused by polishing with the comparative polishing composition of approximately 4 nm.

EXAMPLE 3

This example demonstrates the effect of an organic carboxylic acid, a polyaminocarboxylic acid, an amine, and a tetraalkylammonium salt on the removal rate and surface roughness observed for silicon substrates achievable by the polishing composition of the invention.

Two similar substrates, which substrates comprised 102 cm (4 inch) diameter circular silicon wafers, were polished with two different polishing compositions (Polishing Compositions 3A and 3B). Polishing Compositions 3A and 3B contained 1 wt. % wet-process silica, 0.0167 wt. % ethylenediaminetetraacetic acid, 0.067 wt. % piperazine, 0.27 wt. % tetramethylammonium hydroxide, and 0.05 wt. % potassium bicarbonate. Polishing Composition 3B (invention) further contained 0.033 wt. % benzilic acid.

Following polishing, the removal rates for silicon and the magnitude of the change in nanotopography, $\Delta R_z/d$, were determined for each of the polishing compositions. The results are summarized in Table 3.

TABLE 3

| Polishing Composition | Silicon Removal Rate (Å/min) | $\Delta R_z/d$ (nm) |
|---|---|---|
| 3A | 6250 | 6 |
| 3B | 2550 | −6 |

As is apparent from the results set forth in Table 3, the inventive polishing composition exhibited a silicon removal rate that was approximately 42% of the removal rate exhibited by the comparative polishing composition, yet the inventive polishing composition exhibited a decrease in surface roughness caused by polishing of approximately 6 nm as compared to an increase in surface roughness caused by polishing with the comparative polishing composition of approximately 6 nm.

EXAMPLE 4

This example demonstrates the effect of a diol compound, a polyaminocarboxylic acid, an amine, and a tetraalkylammonium salt on the removal rate and surface roughness observed for silicon substrates achievable by the polishing composition of the invention.

Two similar substrates, which substrates comprised 102 cm (4 inch) diameter circular silicon wafers, were polished with two different polishing compositions (Polishing Compositions 4A and 4B). Polishing Compositions 4A and 4B contained 1 wt. % wet-process silica, 0.0167 wt. % ethylenediaminetetraacetic acid, 0.067 wt. % piperazine, 0.27 wt. % tetramethylammonium hydroxide, and 0.05 wt. % potassium bicarbonate. Polishing Composition 3B (invention) further contained 0.033 wt. % 2,4-pentanediol (i.e., a diol compound).

Following polishing, the removal rates for silicon and the magnitude of the change in nanotopography, $\Delta R_z/d$, were determined for each of the polishing compositions. The results are summarized in Table 4.

TABLE 4

| Polishing Composition | Silicon Removal Rate (Å/min) | $\Delta R_z/d$ (nm) |
|---|---|---|
| 4A (comparative) | 5350 | −0.5 |
| 4B (invention) | 4375 | −5 |

As is apparent from the results set forth in Table 4, the inventive polishing composition exhibited a silicon removal rate that was approximately 82% of the removal rate exhibited by the comparative polishing composition, yet the inventive polishing composition exhibited a decrease in surface roughness caused by polishing of approximately 5 nm as compared to a decrease in surface roughness caused by polishing with the comparative polishing composition of approximately −0.5 nm.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition consisting essentially of:
   (a) about 0.5 wt. % to about 20 wt. % of wet process silica,
   (b) about 0.02 wt. % to about 5 wt. % of one or more nitrogen containing heterocyclic compounds, wherein at least one nitrogen containing heterocyclic compound is a triazole,
   (c) about 0.05 wt. % to about 2 wt. % of one or more aminophosphonic acids,
   (d) about 0.1 wt. % to about 5 wt. % of one or more tetraalkylammonium salts,
   (e) potassium bicarbonate, and
   (f) water,
   wherein the polishing composition has a pH of about 7 to about 11.

2. The polishing composition of claim 1, wherein the polishing composition contains about 10 wt. % to about 15 wt. % of silica.

3. The polishing composition of claim 1, wherein the polishing composition contains about 0.1 wt. % to about 2 wt. % of the nitrogen containing heterocyclic compound.

4. The polishing composition of claim 1, wherein the nitrogen containing heterocyclic compound is an aminotriazole.

5. The polishing composition of claim 4, wherein the aminotriazole is selected from the group consisting of 3 amino 1,2,4 triazole, 3 amino 1,2,4 triazole 5 carboxylic acid, 3 amino 5 mercapto 1,2,4 triazole, and 4 amino 5 hydrazino 1,2,4 triazole 3 thiol.

6. The polishing composition of claim 1, wherein at least one nitrogen containing heterocyclic compound is a thiazole.

7. The polishing composition of claim 6, wherein the thiazole is selected from the group consisting of 2 amino 5 methylthiazole, 2 amino thiazoleacetic acid, and thiazole.

8. The polishing composition of claim 1, wherein at least one nitrogen containing heterocyclic compound is a heterocyclic N oxide.

9. The polishing composition of claim 8, wherein the nitrogen containing heterocyclic compound is selected from the group consisting of 2 hydroxypyridine N oxide, 4 methylmorpholine N oxide, and picolinic acid N oxide.

10. The polishing composition of claim 1, wherein the polishing composition contains about 0.1 wt. % to about 1 wt. % of at least one aminophosphonic acid.

11. The polishing composition of claim 10, wherein the aminophosphonic acid is selected from the group consisting of ethylenediaminetetra(methylene phosphonic acid), amino tri(methylene phosphonic acid), diethylenetriaminepenta(methylene phosphonic acid), and combinations thereof.

12. The polishing composition of claim 11, wherein the aminophosphonic acid is amino tri(methylene phosphonic acid).

13. The polishing composition of claim 1, wherein the polishing composition has a pH of about 8 to about 10.

* * * * *